(12) United States Patent
Chen et al.

(10) Patent No.: US 9,150,408 B2
(45) Date of Patent: *Oct. 6, 2015

(54) METHOD OF ETCHING A WAFER

(71) Applicant: Analog Devices, Inc., Norwood, MA (US)

(72) Inventors: Li Chen, Belmont, MA (US); Mitul Dalal, South Grafton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/338,754

(22) Filed: Jul. 23, 2014

(65) Prior Publication Data

US 2014/0332945 A1 Nov. 13, 2014

Related U.S. Application Data

(63) Continuation of application No. 13/165,934, filed on Jun. 22, 2011, now Pat. No. 8,815,624.

(60) Provisional application No. 61/357,287, filed on Jun. 22, 2010.

(51) Int. Cl.
| | |
|---|---|
| *H01L 23/02* | (2006.01) |
| *B81C 1/00* | (2006.01) |
| *H01L 21/48* | (2006.01) |
| *H01L 21/50* | (2006.01) |
| *H01L 23/04* | (2006.01) |
| *B81B 7/00* | (2006.01) |

(52) U.S. Cl.
CPC ............ *B81C 1/00269* (2013.01); *B81B 7/0058* (2013.01); *B81C 1/00333* (2013.01); *B81C 1/00523* (2013.01); *H01L 21/4803* (2013.01); *H01L 21/50* (2013.01); *H01L 23/04* (2013.01); *B81C 2203/0118* (2013.01)

(58) Field of Classification Search
CPC ............ B81C 1/00269; B81C 1/00333; B81C 2203/0118; B81C 23/04
See application file for complete search history.

(56) References Cited

U.S. PATENT DOCUMENTS

| | | | |
|---|---|---|---|
| 5,668,033 A | 9/1997 | Ohara et al. | 438/113 |
| 6,686,225 B2 | 2/2004 | Wachtler | 438/114 |
| 6,777,263 B1 | 8/2004 | Gan et al. | 438/106 |
| 7,183,622 B2 | 2/2007 | Heck et al. | 257/528 |
| 8,227,339 B2 | 7/2012 | Ponoth et al. | 438/638 |
| 8,815,624 B2 * | 8/2014 | Dalal et al. | 438/51 |

\* cited by examiner

*Primary Examiner* — Howard Weiss
(74) *Attorney, Agent, or Firm* — Sunstein Kann Murphy & Timbers LLP

(57) ABSTRACT

A method of etching a plurality of cavities in a wafer provides a wafer having a patterned hard mask layer. The patterned hard mask has open areas defining locations for first cavities and second cavities. A mask is applied to cover the patterned hard mask layer. The mask is etched to remove wafer material from areas defined by the second cavities. The mask is removed and etching then removes wafer material except as prevented by the hard mask layer. This leaves the first cavities with a first depth and further deepens the second cavities to a depth greater than the first depth. By suitably configuring the second cavities, a capped die can be formed by securing the wafer to a second wafer and removing at least a portion of the unsecured side of the first wafer to expose the second cavities, thereby forming a plurality of caps on the second wafer.

30 Claims, 6 Drawing Sheets

METHOD OF ETCHING A WAFER

The present application is a continuation of U.S. Ser. No. 13/165,934, filed Jun. 22, 2011, now U.S. Pat. No. 8,815,624, and claims priority from U.S. provisional application Ser. No. 61/357,287, filed Jun. 22, 2010, the disclosures of which are hereby incorporated herein by reference in their entirety. The abstract and the summary have been revised to better conform to the claims of the present application.

BACKGROUND ART

Generally speaking, a microelectromechanical system ("MEMS") is a highly miniaturized device having both electrical and mechanical components. MEMS devices are typically fabricated on or from a substrate material, such as a silicon wafer or polysilicon material. A variety of long used, well-known techniques form electrical and mechanical structures in the MEMS devices.

The mechanical structures of the MEMS are typically very fragile, and can be easily damaged. Furthermore, the mechanical structures of the MEMS are typically very sensitive, and can be easily impeded. Many factors can affect MEMS performance, including dirt, moisture, and even static electricity.

To protect the fragile microstructure, many MEMS devices have a cap secured over substantially all of the MEMS mechanical components. The cap typically forms a cavity with the device die to allow the MEMS structures to move while simultaneously protecting the structures from the operating ambient. The cap thus is bonded onto the MEMS die in such a way that the MEMS structures to be protected are positioned within this cavity. In some applications, this bond is formed so that the device is hermetically sealed against contaminants.

SUMMARY OF THE INVENTION

In accordance with one embodiment of the invention, a method of forming a capped die provides a cap wafer having a top side and a bottom side. The bottom side is formed with 1) a plurality of device cavities having a first depth, and 2) a plurality of second cavities that each have a greater depth than the first depth. At least some of the plurality of second cavities each generally circumscribe at least one of the device cavities. The method then secures the cap wafer to a device wafer in a manner that causes a plurality of the device cavities each to circumscribe at least one of circuitry and structure on the device wafer. Next, the method removes at least a portion of the top side of the cap wafer to expose the second cavities. This forms a plurality of caps that each protect the noted circuitry and structure.

Some embodiments backgrind the top side of the cap wafer to remove its top surface. Moreover, the method also may singulate the device wafer to form a plurality of individual capped dies.

The etching method forms first cavities and second cavities using two separate masks. For example, a first mask may be applied over an oxide layer on the bottom side of a wafer to define areas for the first cavities and the second cavities. The wafer is etched to remove the oxide layer from the areas for the first cavities and the second cavities. Then a second mask may be applied leaving the areas for the second cavities exposed and covering the areas for the device cavities. The wafer is etched to remove wafer material from the areas for the second cavities. The second mask is removed and the wafer etched once more. Now wafer material in areas not covered by the oxide layer is removed to form the first cavities and to further deepen the second cavities. Those in the art should understand that the plurality of second cavities can have varying depths, or generally the same depths.

The device wafer can have any of a variety of types of components. For example, the device wafer can include MEMS microstructure and/or circuitry. Additionally, some embodiments form a conductive bond between the cap wafer and the device wafer.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In addition to forming device cavities, illustrative embodiments fabricate a cap wafer with deep singulation cavities before securing it to a corresponding device wafer. When bonded to the device wafer, each of these deep cavities generally circumscribes a corresponding device cavity, i.e., an area on the device wafer that ultimately will form a single die. Various embodiments singulate the cap wafer simply by reducing the thickness of cap wafer to expose the deep cavities. Details of illustrative embodiments are discussed below.

Figure 1:
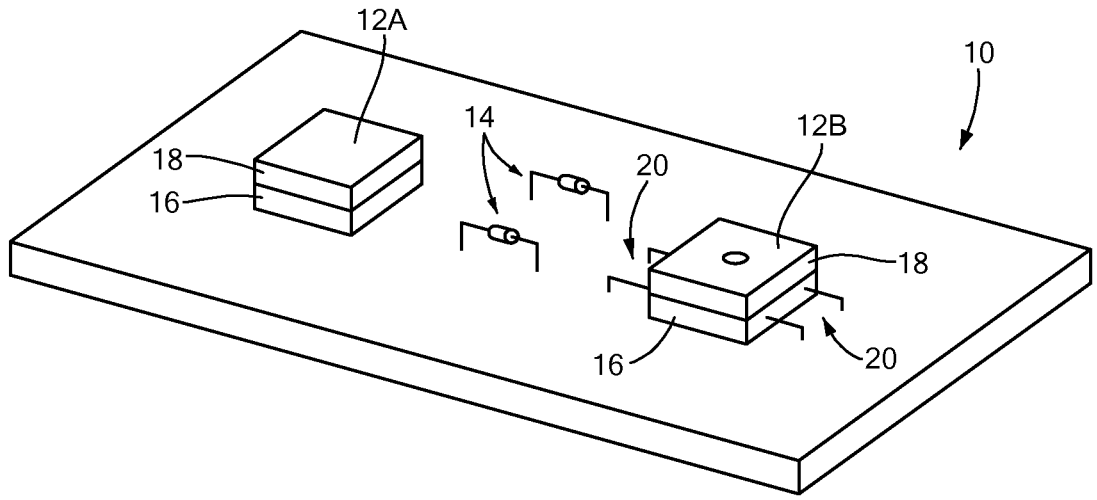
FIG. 1 schematically shows a printed circuit board having capped dies configured in accordance with illustrative embodiments of the invention.

FIG. 1 schematically shows a printed circuit board 10 having capped dies 12A and 12B configured in accordance with illustrative embodiments of the invention. This circuit board 10 may be part of a larger system, such as an automobile airbag system, a transducer system, a guidance system, a computer system, or other application. To those ends, the circuit board 10 supports and connects a plurality of different circuit components 12A, 12B, and 14 (discussed below) in the prescribed manner. FIG. 1 shows only a few components 12A, 12B, and 14 for simplicity.

The components 12A, 12B, and 14 shown include a sealed capped die 12A (capped dies also generally are referred to as a capped microchips or capped devices) surface mounted to the printed circuit board 10, an unsealed capped die 12B, and other active or passive circuit components 14. Among other things, the capped dies 12A and 12B could have MEMS microstructure, circuitry, or both. For example, the sealed capped die 12A may be an inertial sensor, such as a MEMS accelerometer or MEMS gyroscope, a MEMS optical switch, or a MEMS electrostatic switch. Exemplary MEMS gyroscopes are discussed in greater detail in U.S. Pat. No. 6,505,511, which is assigned to Analog Devices, Inc. of Norwood, Mass.. Exemplary MEMS accelerometers are discussed in greater detail in U.S. Pat. No. 5,939,633, which also is assigned to Analog Devices, Inc. of Norwood, Mass.. The disclosures of U.S. Pat. Nos. 5,939,633 and 6,505,511 are incorporated herein, in their entireties, by reference.

The unsealed capped die 12B may include functionality that requires access to the ambient environment, but some protection. For example, the unsealed capped die 12B may include a microphone or pressure sensor. One or both of the capped dies 12A and 12B may include circuitry, such as that included in IMEMS devices distributed by Analog Devices, Inc.

Both dies thus have a device die 16 with structure and/or circuitry, and a cap 18 protecting the structure and/or circuitry. The sealed die shown is surface mounted to the circuit board 10, while the unsealed die has pins 20 to electrically connect to the circuit board 10. Either type of electrical interconnect method should suffice for various embodiments.

Figure 2:
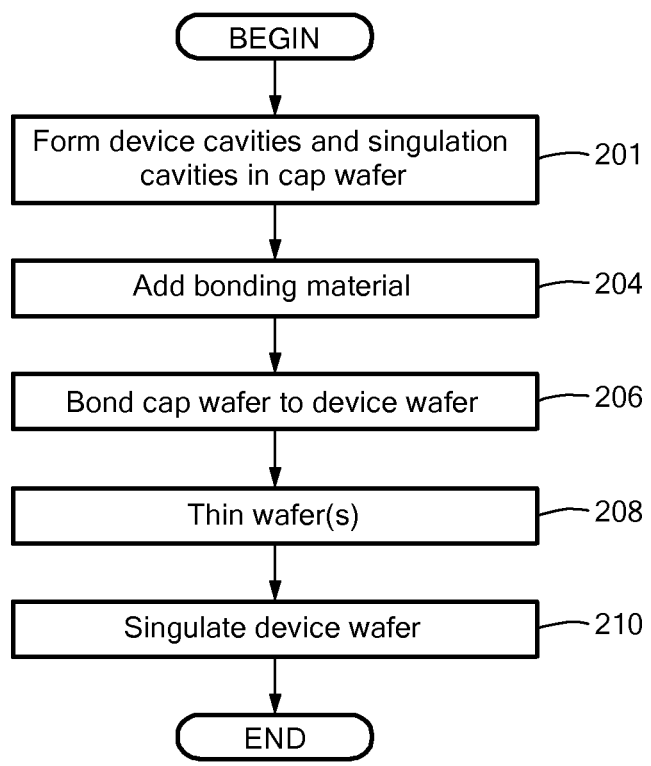
FIG. 2 shows a process of fabricating a capped die in accordance with illustrative embodiments of the invention.

FIG. 2 shows a process of forming capped MEMS dies/chips (generally referred to using reference number 12) in accordance with illustrative embodiments of the invention. It should be noted that discussion of MEMS devices is illustrative only. Accordingly, principles of the embodiments discussed can apply to other devices that do not incorporate MEMS technology. Moreover, while each of the steps in this process may be executed sequentially, some may be performed substantially simultaneously, and/or in a different order at different times.

Before beginning the process, or during the beginning steps of the process, conventional fabrication techniques form an array of devices on a separate device wafer 24 (discussed below). For example, each of the devices may include MEMS microstructure, active and/or passive circuitry (e.g., CMOS circuits), or both.

The process of FIG. 2 begins at step 201 by forming an array of device cavities 22 and singulation cavities in the cap wafer 26. The array of device cavities 22 are spaced in a manner that corresponds with the spacing of the array of devices formed on the device wafer 24. To that end, conventional processes form a first etch mask on the bottom side of the cap wafer 26. This mask has a plurality of openings corresponding to the array of device cavities 22 to be formed. Illustrative embodiments perform a timed etch with a conventional etchant (e.g., HF acid). The device cavities 22 should have a depth that, when connected with the device wafer 24, do not impede operation of the device being protected. For example, the device cavities 22 may have a depth of between five and twenty microns, which should both protect and permit operation of certain MEMS microstructure.

Figure 3A:
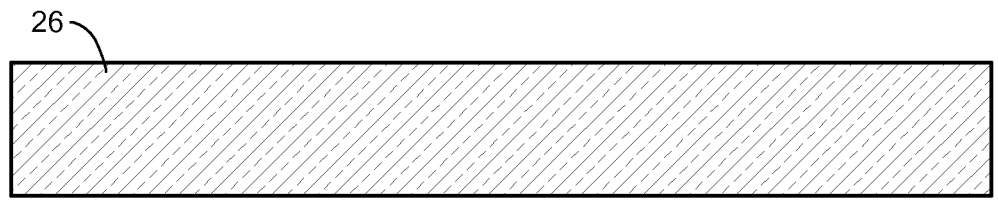
FIGS. 3A-3C schematically show cross-sectional views of a portion of a cap wafer fabricated as processed in accordance with illustrative embodiments of the invention.
Figure 3B:
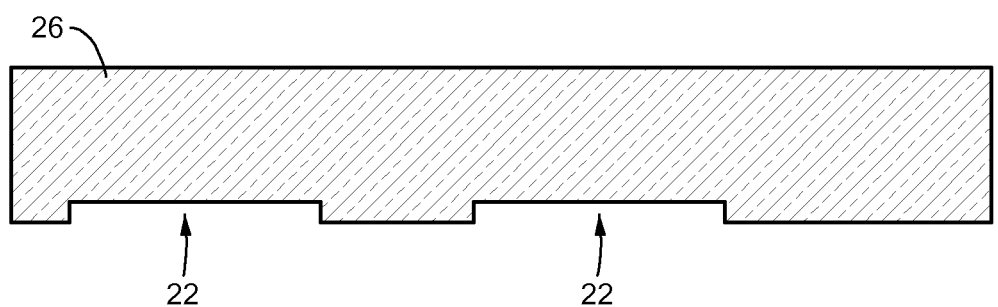

FIG. 3A schematically shows a cross-sectional view of a cap wafer 26 before processing. Corresponding with step 200, however, FIG. 3B schematically shows a cross-sectional view of a cap wafer 26 after forming the device cavities 22. It should be noted that this figure is merely a schematic, two-dimensional diagram and thus, only shows two cavities. Accordingly, the cap wafer 26 can have dozens, hundreds, or thousands of device cavities 22.

In addition to the device cavities 22 an array of singulation cavities 28 are required in the cap wafer 26. In accordance with one embodiment. the first mask is removed and the process continues to form the singulation cavities 28. Specifically, in illustrative embodiments, a singulation cavity 28 is formed about each device cavity 22. Each singulation cavity 28 can have any shape that is appropriate for the given application—it preferably completely circumscribes one (or more, in some embodiments) device cavity 22. For example, the singulation cavity 28 can be rectangular, oval, round, irregularly shaped, or some other shape.

Figure 3C:
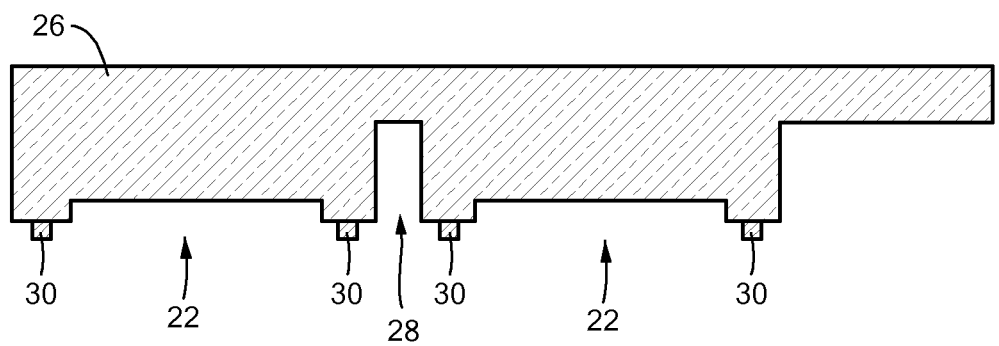

To those ends, the process forms a second mask on the bottom side of the cap wafer 26, and performs a timed etch using an appropriate etchant (e.g., HF acid). In accordance with illustrative embodiments, many or all of these singulation cavities 28 are deeper than the device cavities 22. For example, the singulation cavities 28 can be between two and ten times deeper than the device cavities 22. As an example, a cap wafer 26 having device cavities 22 of between five and ten microns can have singulation cavities 28 of between twenty-five and thirty microns. FIG. 3C schematically shows this relationship. In alternative embodiments, the depth of the singulation cavities 28 vary across the same cap wafer 26.

FIG. 3C also shows bonding material 30, added by step 306. For example, conventional processes may screen print bonding material 30 onto the appropriate bottom surface of the cap wafer 26. The bonding material 30 may include a conductive material to ground the cap 18 (e.g., aluminum), or non-conductive material (e.g., glass frit). Some embodiments also form a corresponding bonding material 30 on the device wafer 24.

Figure 4A:
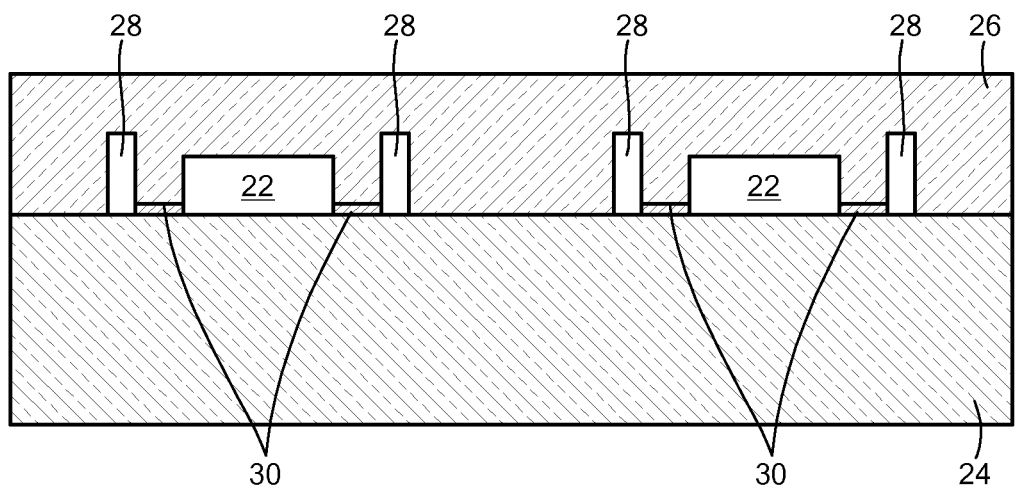
FIG. 4A schematically shows a cross-sectional view of a portion of a cap wafer and device wafer before removing any portion of the cap wafer.
Figure 4B:
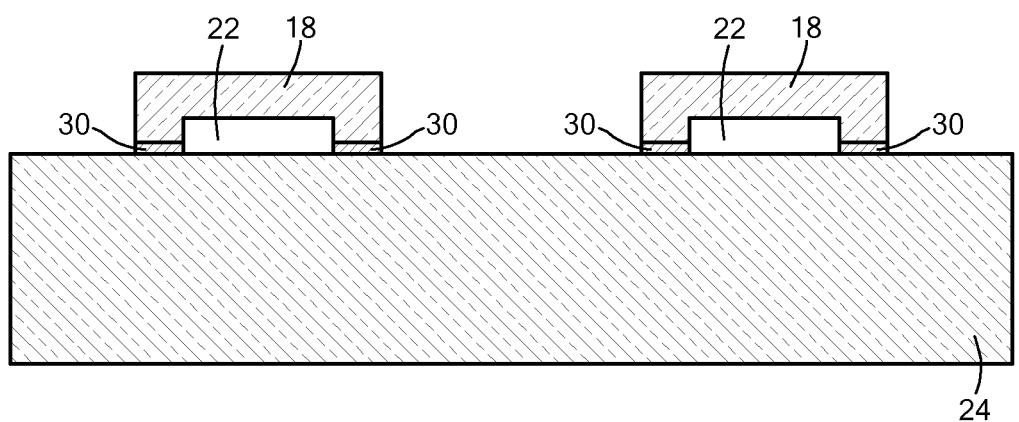
FIG. 4B schematically shows the cross-sectional view of FIG. 4A after removing a portion of the cap wafer.

The process continues to step 206, which bonds the cap wafer 26 to the device wafer 24. To that end, conventional fixtures apply appropriate amounts of heat and pressure to bond the two wafers together. As noted, the device cavities 22 align with the devices on the device wafer 24 to ensure appropriate device protection. FIG. 4A schematically shows the two bonded wafers at this stage of the process. In a manner similar to FIGS. 3A-3C, FIGS. 4A and 4B schematically show portions of much larger wafers.

The process then singulates the cap wafer 26 into a plurality of individual caps 18. To that end, conventional processes thin the cap wafer 26 from its top side (step 208, FIG. 4B). Among other ways, the process can use backgrinding, etching processes, or other wafer thinning processes. Some embodiments also thin the bottom side of the device wafer 24. At least a portion of the top side of the cap wafer 26 thus is removed to expose the singulation cavities 28, exposing corresponding portions of the top surface of the device wafer 24. Accordingly, this step effectively singulates the cap wafer 26.

In some embodiments, this step also exposes test pads on the device wafer 24. Thus, testing engineers can test the capped chips 12 before singulating the entire device wafer 24. After thinning but before testing, the process can introduce a high-pressure wash with a surfactant to ensure the integrity of the electrical testing pads.

The process concludes by singulating the device wafer 24 to form a plurality of individual capped dies/chips 12 (step 210).

Accordingly, illustrative embodiments form cavities of differing depths to reduce singulation processing steps. This reduction in processing steps should improve throughput, and reduce costs.

Figure 5A:
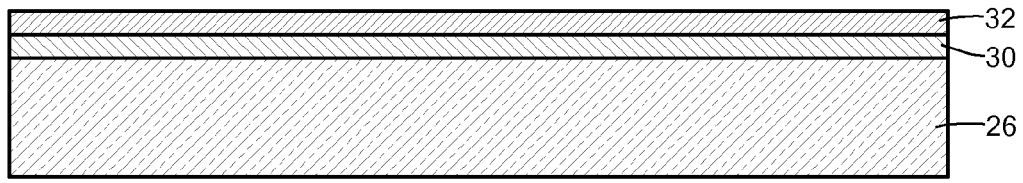
FIGS. 5A-5F schematically show cross-sectional views of a portion of a cap wafer fabricated by an etching process in accordance with illustrative embodiments of the invention.

Referring now to FIGS. 5A-5F an etching process in accordance with an embodiment of the invention, may be used to facilitate forming cavities of different depths in the cap wafer. Beginning with a silicon wafer, a bonding material layer 30 may be applied to the bottom side of the wafer 26. In specific embodiments, the bonding material is germanium applied as a one micron layer using plasma vapor deposition (PVD). As illustrated in FIG. 5A, a hard mask layer 32 is applied on top of the bonding material layer 30. The hard mask layer 32, in specific embodiments, may be a 5 kA oxide layer. A conventional deposition process may be used for depositing the oxide over the bonding material layer on the bottom side of the wafer.

Figure 5B:
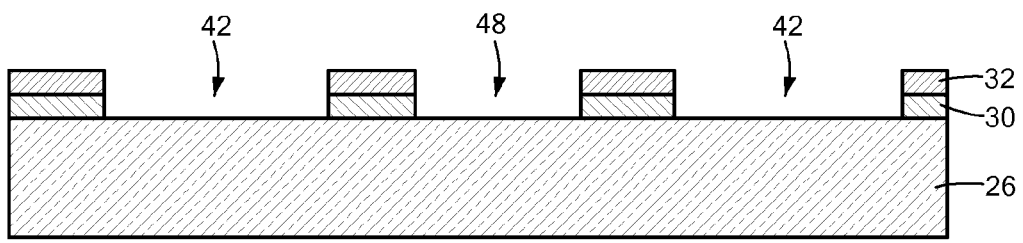

A first mask is patterned on the hard mask layer 32 to define areas 42 for the first cavities and areas 48 for the second cavities. The first mask, in accordance with a preferred embodiment, can be silicon oxide. In an alternative embodiment, the first mask can be silicon nitride. In specific embodiments, the first cavities are the device cavities 22 and the second cavities are the singulation cavities 28. The second cavities will be made a greater depth than the first cavities. As described above, in specific embodiments, a singulation cavity 28 circumscribes one or more device cavity 22. The wafer is etched through the first mask to remove the hard mask layer and the bonding material layer from the areas for the first and second cavities. The etch may be performed with a standard etch such as aqueous HF (BOE—buffered oxide etch) or ChF3+CF4+He dry anisotropic etch to remove oxide in cavity areas. The resulting portion of a wafer is shown in FIG. 5B.

Figure 5C:
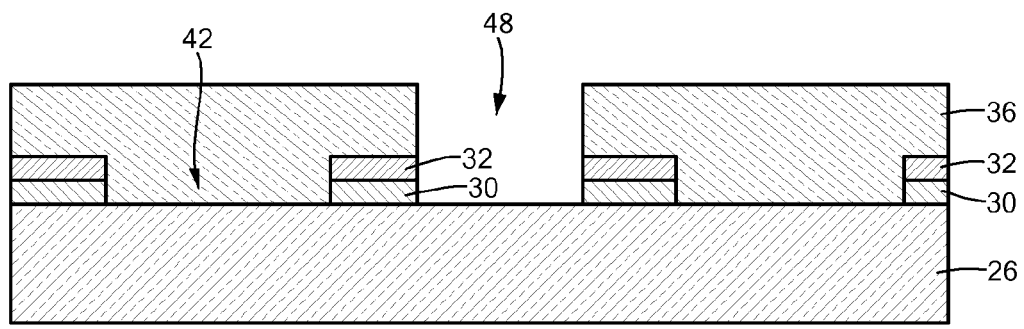

As shown in FIG. 5C, a photoresist mask 36 is applied over the bottom side of the wafer. The mask 36 covers the areas 42 for the device cavities. The mask 36 is patterned to leave exposed the areas 48 for the second cavities. In accordance with a specific embodiment, the mask 36 is a Shipley DRIE resist spun to 4 microns.

Figure 5D:
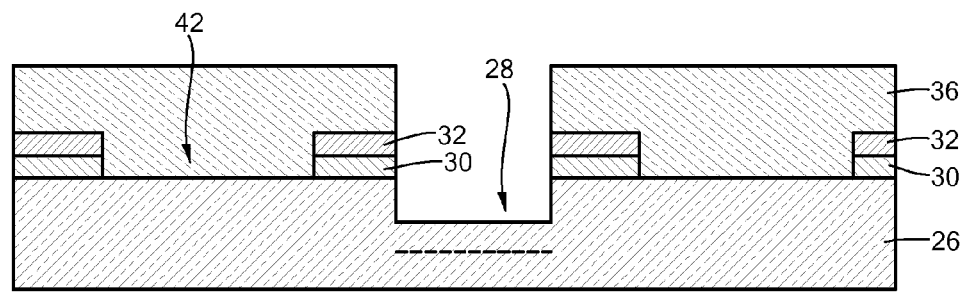

In accordance with aspects of the etching process, the wafer is etched to remove wafer material from the areas for the second cavities, as shown in FIG. 5D. The etch is deep but purposefully less deep than the desired final depth. In specific embodiments, the deep silicon etch is 120 microns deep and is 20 microns less than the final target depth. A suitable Deep Reactive Ion Etch (DRIE) for use with silicon may be used. For example, the etch may be SF6/C4F8. This is commonly sold as Bosch DRIE.

Figure 5E:
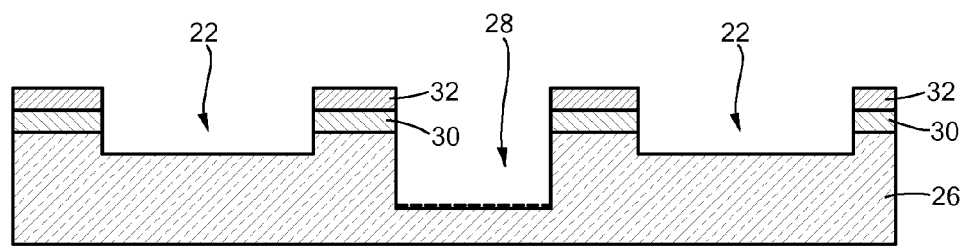
Figure 5F:
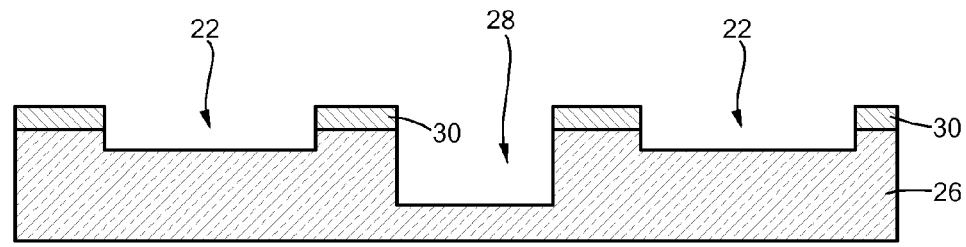

After having etched the second cavities, the mask 36 is removed. This leaves the hard mask 32 to protect the bottom of the silicon wafer from the etch. Etching is now performed on the bottom side of the wafer to remove wafer material from areas not covered by the hard mask layer 32. This etch may use the same deep silicon etch as used in the previous process step, but for shorter time. As shown in FIG. 5E, this forms the completed first and second cavities. In specific embodiments, the first cavity is a device cavity of 20 microns in depth. Thus, 20 microns are also added to the depth of the second cavities. In a specific embodiment, the second cavity is a singulation cavity of 140 microns in depth. The device cavities are suitable for enclosing a MEMS structure on a device wafer and the second cavities are suitable for singulation. In particular, thinning of the wafer will separate it into separate caps. With regard to FIG. 5F, the hard mask layer 32 is removed to reveal the bonding material layer. The hard mask removal can be done using the same etch as was used to pattern the hard mask. As an alternative, a more concentrated 49:1 HF can be used for quicker removal of the hard mask layer. The silicon wafer is then ready for use as a cap wafer to be attached to a device wafer.

Figure 6A:
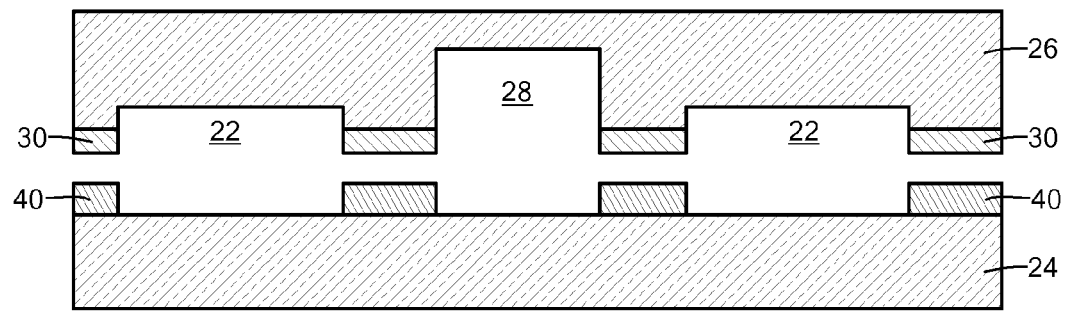
FIG. 6A schematically shows a cross-sectional view of the portion of the cap wafer of FIG. 5F and a device wafer before bonding them together.

Processing the etched cap wafer along with a device wafer proceeds along the lines previously described above. FIG. 6A shows bonding material 40 on device wafer 24. Conventional processes may screen print bonding material 40 onto the top surface of the device wafer 24. The bonding material 40 may include a conductive material to ground the caps (e.g., aluminum), or non-conductive material (e.g., glass frit). In a specific embodiment, the bonding material 30 on the cap wafer 26 is germanium and the bonding material 40 on the device wafer is aluminum.

The cap wafer 26 is bonded to the device wafer 24. To that end, conventional fixtures apply appropriate amounts of heat and pressure to bond the two wafers together. As noted, the device cavities 22 align with the devices and/or circuits on the device wafer 24 so as to result in capped protection for each of the devices and/or circuits.

Figure 6B:
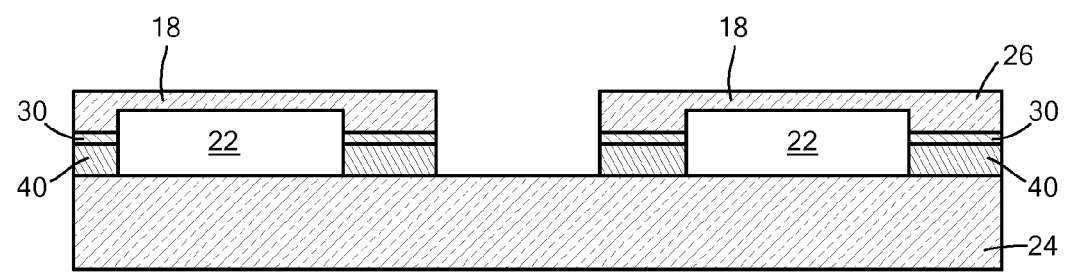
FIG. 6B schematically shows a cross-sectional view of the bonded cap wafer and device wafer after removing a portion of the cap wafer.

At this stage of the process, the capped device wafer is advantageously ready for singulating the cap wafer by use of a thinning process. Conventional processes thin the cap wafer 26 from its top side. Among other ways, the process can use backgrinding, etching processes, or other wafer thinning processes. Some embodiments also thin the bottom side of the device wafer 24. At least a portion of the top side of the cap wafer 26 thus is removed to expose the singulation cavities 28, exposing corresponding portions of the top surface of the device wafer 24. Accordingly, this step effectively singulates the cap wafer 26 into individual caps 18 as shown in FIG. 6B.

The process concludes by singulating the device wafer 24 to form a plurality of individual capped dies/chips 12.

Although the above discussion discloses various exemplary embodiments of the invention, it should be apparent that those skilled in the art can make various modifications that will achieve some of the advantages of the invention without departing from the true scope of the invention.

What is claimed is:

1. A method of etching a plurality of cavities in a wafer, the method comprising:
   providing a wafer having a patterned hard mask layer on a side of the wafer, the patterned hard mask layer having open areas to define locations for first cavities and second cavities;
   applying a mask over the side of the wafer, thereby covering the patterned hard mask layer;
   after applying the mask, etching the wafer to remove wafer material from areas defining the second cavities;
   removing the mask;
   after removing the mask, performing a step of etching, wherein removal of wafer material is prevented by the hard mask layer at areas covered by the hard mask layer and removal of wafer material takes place in areas not covered by the hard mask layer so as to form a plurality of first cavities in the side of the wafer, the first cavities having a first depth, and to further deepen a plurality of second cavities in the side, such that each of the second cavities has a greater depth than the first depth.

2. The method of claim 1 wherein at least some of the first cavities are circumscribed by at least one of the second cavities.

3. The method of claim 1 wherein the first depth is between 5 and 20 microns.

4. The method of claim 2 wherein the greater depth of the second cavities is between two and ten times deeper than the first depth.

5. The method of claim 1 wherein the patterned hard mask layer comprises an oxide layer.

6. The method of claim 1 wherein the wafer comprises a cap wafer and wherein the side of the wafer is a bottom side of the cap wafer, such that the patterned hard mask layer is on the bottom side of the cap wafer.

7. A method of forming a capped die comprising:
   providing a wafer etched in accordance with claim 1;
   securing the side of the wafer to a second wafer.

8. The method of claim 7 wherein securing comprises forming a conductive bond between the wafer and the second wafer.

9. The method of claim 7 further comprising providing a MEMS microstructure oriented within one of the first cavities.

10. The method of claim 7 further comprising backgrinding a surface of the wafer opposite the secured side to expose the second cavities.

11. The method of claim 10 wherein the first cavities comprise device cavities each enclosing at least one of circuitry and a movable structure on the second wafer and wherein backgrinding forms a plurality of caps that each protect the at least one of circuitry and movable structure.

12. The method of claim 10 wherein at least some of the first cavities are circumscribed by at least one of the second cavities.

13. The method of claim 10 wherein the first depth is between 5 and 20 microns.

14. The method of claim 10 further comprising singulating the device wafer to form a plurality of individual capped dies.

15. A device formed by the method of claim 7.

16. A method of etching a wafer comprising:
    applying a hard mask layer on a side of a wafer;
    applying a first mask to the hard mask layer defining areas for first cavities and second cavities;
    etching the wafer to remove the hard mask layer from the areas for the first cavities and the second cavities leaving a patterned hard mask layer on the side of the wafer;
    applying a second mask over the side of the wafer leaving the areas for the second cavities exposed and covering the areas for the first cavities and the patterned hard mask layer;
    after applying the second mask, etching the wafer to remove wafer material from the areas for the second cavities;
    removing the second mask; and
    after removing the second mask, etching the wafer, wherein removal of wafer material is prevented by the hard mask layer at areas covered by the hard mask layer and removal of wafer material takes place in areas not covered by the hard mask layer so as to form the first cavities and to further deepen the second cavities, the second cavities having a greater depth than the first cavities.

17. The method of claim 16 wherein at least some of the first cavities are circumscribed by at least one of the second cavities.

18. The method of claim 16 wherein the depth of the first cavities is between 5 and 20 microns.

19. The method of claim 18 wherein the depth of the second cavities is between two and ten times deeper than the depth of the first cavities.

20. The method of claim 16 further comprising removing the hard mask layer after etching the wafer to remove wafer material in areas not covered by the hard mask layer.

21. The method of claim 16 further comprising applying a bonding material layer to the wafer before depositing the hard mask layer thereon.

22. The method of claim 16 wherein applying a hard mask layer comprises depositing an oxide layer.

23. A method of forming a capped die comprising:
    providing a wafer etched in accordance with claim 16;
    securing the side of the wafer to a second wafer.

24. The method of claim 23 further comprising providing a MEMS microstructure oriented within one of the first cavities.

25. The method of claim 23 wherein securing comprises forming a conductive bond between the wafer and the second wafer.

26. The method of claim 23 further comprising removing a surface of the wafer opposite the secured side to expose the second cavities.

27. The method of claim 26 wherein removing comprises backgrinding.

28. The method of claim 26 wherein exposing the second cavities forms a plurality of caps on the second wafer.

29. The method of claim 28 wherein the plurality of caps each includes one of the device cavities oriented so as to circumscribe a MEMS microstructure.

30. A device formed by the method of claim 23.

* * * * *